United States Patent
Ito et al.

(10) Patent No.: US 9,614,188 B2
(45) Date of Patent: Apr. 4, 2017

(54) ORGANIC ELECTROLUMINESCENT ELEMENT AND LIGHTING DEVICE

(71) Applicant: PANASONIC INTELLECTUAL PROPERTY MANAGEMENT CO., LTD., Osaka (JP)

(72) Inventors: Norihiro Ito, Osaka (JP); Takashi Anjiki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/902,879

(22) PCT Filed: Jul. 1, 2014

(86) PCT No.: PCT/JP2014/003500
§ 371 (c)(1),
(2) Date: Jan. 5, 2016

(87) PCT Pub. No.: WO2015/004876
PCT Pub. Date: Jan. 15, 2015

(65) Prior Publication Data
US 2016/0155989 A1    Jun. 2, 2016

(30) Foreign Application Priority Data
Jul. 12, 2013   (JP) .................................. 2013-146946

(51) Int. Cl.
*H01L 51/52* (2006.01)
*H05B 33/02* (2006.01)
(Continued)

(52) U.S. Cl.
CPC ...... *H01L 51/5271* (2013.01); *H01L 27/3276* (2013.01); *H01L 51/5012* (2013.01);
(Continued)

(58) Field of Classification Search
CPC combination set(s) only.
See application file for complete search history.

(56) References Cited

U.S. PATENT DOCUMENTS 9,012,902 B2 * 4/2015 Ide et al.
9,105,873 B2 * 8/2015 Tsuji et al.
(Continued)

FOREIGN PATENT DOCUMENTS

JP   11-260563    * 9/1999
JP   2003-123987  * 4/2003
(Continued)

OTHER PUBLICATIONS

International Search Report issued by PCT patent office in Patent Application No. PCT/JP2014/003500, dated Sep. 16, 2014.*

*Primary Examiner* — Mamadou Diallo
(74) *Attorney, Agent, or Firm* — Greenblum & Bernstein, P.L.C.

(57) ABSTRACT

An organic electroluminescent element includes an optically transparent electrode, a counter electrode, an emission layer, an auxiliary reflective layer and a diffusion-preventing layer. The counter electrode is paired with the optically transparent electrode and formed of Ag or an alloy containing Ag and has light reflectivity. The emission layer is disposed between the optically transparent electrode and the counter electrode. The auxiliary reflective layer is disposed on an opposite side of the counter electrode from the emission layer. The diffusion-preventing layer is disposed between the counter electrode and the auxiliary reflective layer whose components are prevented from diffusing and moving therebetween.

8 Claims, 5 Drawing Sheets

(51) Int. Cl.
*H05B 33/24* (2006.01)
*H05B 33/26* (2006.01)
*H01L 27/32* (2006.01)
*H01L 51/50* (2006.01)

(52) U.S. Cl.
CPC ...... *H01L 51/5212* (2013.01); *H01L 51/5228* (2013.01); *H05B 33/02* (2013.01); *H05B 33/24* (2013.01); *H05B 33/26* (2013.01); *H01L 2251/5392* (2013.01)

(56) References Cited

U.S. PATENT DOCUMENTS

| | | | |
|---|---|---|---|
| 2005/0088083 A1* | 4/2005 | Seo et al. | |
| 2011/0175513 A1* | 7/2011 | Jeong | H01L 51/5281 313/113 |
| 2012/0235197 A1* | 9/2012 | Okuyama | |
| 2012/0280217 A1* | 11/2012 | Matsuura et al. | |
| 2014/0014950 A1* | 1/2014 | Hara | H01L 27/124 257/43 |
| 2015/0115242 A1* | 4/2015 | Sakaguchi | H01L 51/52 257/40 |
| 2015/0188088 A1* | 7/2015 | Kubota et al. | |
| 2015/0207092 A1* | 7/2015 | Tsuji et al. | |

FOREIGN PATENT DOCUMENTS

| | | | |
|---|---|---|---|
| JP | 2005-158715 | * | 6/2005 |
| JP | 2006-222028 | * | 8/2006 |
| JP | 2007-299689 | * | 11/2007 |
| JP | 2009-54424 | * | 3/2009 |
| JP | 2009-265059 | * | 11/2009 |
| JP | 2011-35324 | * | 2/2011 |
| JP | 2012-69286 | * | 4/2012 |
| JP | 2013-33706 | * | 2/2013 |

* cited by examiner

ORGANIC ELECTROLUMINESCENT ELEMENT AND LIGHTING DEVICE

TECHNICAL FIELD

An invention relating to organic electroluminescent elements and lighting devices including the same is disclosed.

BACKGROUND ART

An organic electroluminescent element has been known in general, which is hereinafter also referred to as an "organic EL element". The organic EL element has a structure in which functional layers like a hole injection layer, a hole transport layer, an emission layer, an electron transport layer, and an electron injection layer are stacked between a cathode and an anode disposed on a substrate. In the organic EL element, voltage is applied between the anode and the cathode, where by planate light is emitted outward from the emission layer.

In the organic EL element, light is emitted outward through an optically transparent electrode. There has been known a light out-coupling structure where an electrode paired with the optically transparent electrode is composed of a reflective electrode so that light from the emission layer is reflected by the reflective electrode to be emitted outward. By using the reflective electrode, it is possible to efficiently emit the light outward.

In the organic EL element, light out-coupling efficiency is important, and a structure to improve light out-coupling property more has been developed. In Japanese Patent Publication Number 2003-123987, a technique for obtaining a high brightness is disclosed, in which an emission layer is disposed between a total reflection mirror and a half mirror, thereby forming a resonant structure. However, in this structure, it is difficult to adjust a thickness of each layer, and it may be hard to form the organic EL element.

Further, as the structure for improving light reflectivity, it is conceivable to increase reflective index of the reflective electrode. For example, the reflectivity of the electrode can be expected to be improved by using silver as an electrode material because silver is a metal having high reflectivity.

It is not however easy to improve electrical reliability of the electrode containing silver because silver has property to be stacked to sneak during film formation, thereby facilitating the occurrence of short circuit when a foreign matter is mixed. Also, using a lot of silver in order to improve reflectivity can cause high-cost and decreasing of economic efficiency

SUMMARY

The invention disclosed below is aim at providing an organic electroluminescent element and a lighting device, each of which has improved reflectivity, high out-coupling efficiency and high electrical reliability, and suppresses short circuit.

The organic EL element is disclosed. The organic EL element includes an optically transparent electrode, a counter electrode, an emission layer, an auxiliary reflective layer and a diffusion-preventing layer. The counter electrode is paired with the optically transparent electrode, and formed of Ag or an alloy containing Ag and has light reflectivity. The emission layer is disposed between the optically transparent electrode and the counter electrode. The auxiliary reflective layer is disposed on an opposite side of the counter electrode from emission layer. The diffusion-preventing layer is disposed between the counter electrode and the auxiliary reflective layer. The diffusion-preventing layer prevents components from diffusing and moving between the counter electrode and the auxiliary layer.

The lighting device is disclosed. The lighting device includes the above organic EL element and wiring.

In the above organic EL element and lighting device, the counter electrode contains silver, and the auxiliary reflective layer and the diffusion-preventing layer is disposed. Therefore, the reflectivity can be improved, the short circuit can be suppressed, and the light out-coupling efficiency and the electrical reliability can be increased.

BRIEF DESCRIPTION OF THE DRAWINGS

FIG. 2 includes FIG. 2A to FIG. 2D and is a sectional view illustrating the effects to a stacking structure containing foreign matter in which

FIG. 7 includes FIG. 7A to FIG. 7B and is graph illustrating a light reflectivity of a light reflecting structure in which

Figure 1:
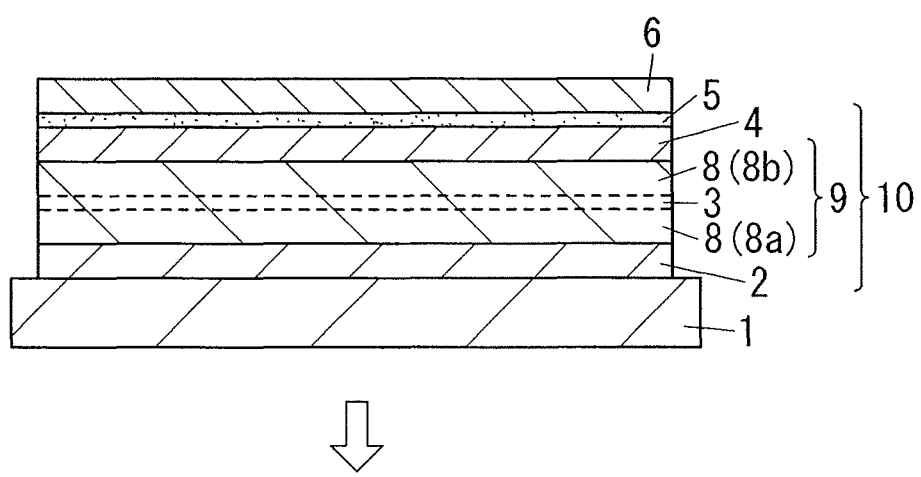
FIG. 1 is a sectional view showing an example of an organic electroluminescent element in an embodiment.

An organic electroluminescent element (an organic EL element) according to the invention is disclosed. The organic EL element includes an optically transparent electrode 2, a counter electrode 4 which is paired with the optically transparent electrode 2 and has light reflectivity, and an emission layer 3 disposed between the optically transparent electrode 2 and the counter electrode 4. The counter electrode 4 is formed of Ag or an alloy containing Ag. An auxiliary reflective layer 6 is disposed on an opposite side of the counter electrode 4 from emission layer 3. A diffusion-preventing layer 5 is disposed between the auxiliary reflective layer 6 and the counter electrode 4. The diffusion-preventing layer 5 prevents components from diffusing and moving between the counter electrode 4 and the auxiliary reflective layer 6. In this organic EL element, the counter electrode 4 containing silver and the auxiliary reflective layer 6 being disposed, thereby improving reflectivity. Also, even in the case of the counter electrode 4 formed of silver or silver alloy, because of the counter electrode 4 having thin enough to reflect by the auxiliary reflective layer 6, it is possible to suppress a short circuit. And also, the diffusion-preventing layer 5 is disposed between the auxiliary reflective layer 6 and the the counter electrode 4, whereby it is possible to suppress reduction in reflectivity and denaturalization of the electrical property caused by diffusion of components. It is therefore possible to improve light reflectivity and the light out-coupling efficiency and electrical reliability, and prevent the short circuit.

FIG. 1 shows an example of an organic EL element in an embodiment. This organic EL element includes an optically transparent electrode 2, an emission layer 3, a counter electrode 4, a diffusion-preventing layer 5 and an auxiliary reflective layer 6. These layers are sustained by an optically transparent substrate 1 serving as a support substrate. In FIG. 1, a boundary division of the emission layer 3 along a thickness direction thereof is shown by a broken line. A white arrow in FIG. 1 shows an emission direction of light.

An organic layer 9 is formed of functional layers including the emission layer 3 and disposed between the optically transparent electrode 2 and the counter electrode 4. The whole of the organic layer 9 includes a collection of the functional layers. An organic luminant 10 includes a stack of the optically transparent electrode 2, the organic layer 9 and the counter electrode 4. Further, when there is no hindrance to emit light, the organic layer 9 may be a structure formed of a single emission layer 3.

The organic luminant 10 is disposed on a surface of the optically transparent substrate 1. The optically transparent substrate 1 is a substrate which sustains a luminous stack. The organic luminant 10 is formed by stacking each layer in order on the optically transparent substrate 1. For example, in FIG. 1, the optically transparent electrode 2, functional layers forming the organic layer 9 and the counter electrode 4 are stacked on the optically transparent substrate 1 in that order.

In the organic EL element shown in FIG. 1, the optically transparent electrode 2 having light permeability is disposed on the surface of the optically transparent substrate 1. In the case of the optically transparent electrode 2 being disposed on the optically transparent substrate 1, it is possible to produce the organic EL element easily. The optically transparent substrate 1 is a support substrate. Further, photons generated in the emission layer 3 will escape from a side of the optically transparent substrate 1. This organic EL element is an element of a so-called bottom-emission structure. Of course, the structure of the organic EL element is not limited to the bottom-emission structure, but may be a top-emission structure. With the top-emission structure, the optically transparent substrate 1 can form a sealed substrate, and a support substrate facing the the optically transparent substrate 1 can be disposed on an opposite side of the counter electrode 4 from the emission layer 3. In this case, the counter electrode 4 is disposed on (a surface of) the support substrate.

The optically transparent substrate 1 is formed of an appropriate substrate material. For example, it may be glass. With glass, the organic luminant 10 can be made and sustained well. It is also possible to suppress an invasion of the water, and deterioration of the organic layer 9. In the case of using glass, glass having high reflective index can be used. As a result, it is possible to reduce a difference in a refractive index. The refractive index of the glass having high refractive index is about 1.7 to 1.9. Of course, ordinary glass whose refractive index is 1.7 or less may be used. The optically transparent substrate 1 may be also formed of plastic. By using the optically transparent substrate 1 formed of plastic, it is possible to improve handle ability. In this case, plastic preferably has a moisture-proof. Because plastic has flexibility, it is possible to form a flexible element. Furthermore, as the optically transparent substrate 1, a composite substrate formed of a stack of a glass layer and a plastic layer can be used. In the composite substrate, it is possible to improve the light out-coupling property. In the case where the optically transparent substrate 1 is formed of the composite substrate, preferably the glass layer is disposed on a light emission side (an outside), and the plastic layer is disposed on a side of the optically transparent electrode 2 (an inside). As a result, it is possible to improve the light out-coupling property and the moisture-proof.

The optically transparent electrode 2 can be formed of an appropriate electrode material. Examples thereof include a metal thin film having optically transparency, a metal oxide film, and the like. Examples of the metal oxide film include ITO, IZO, AZO, and the like. The optically transparent electrode 2 may be also formed of a film layer of a metal oxide film and a metal thin film. Example of the film layer include ITO/Ag, Ag/ITO, Ag alloy/ITO, ITO/Ag alloy, and the like. Here, the material for the counter electrode 4 can be used as Ag alloy. Note that in the examples of the film layer "/" represents a layer boundary, a material in front of "/" represents an under layer (a side of the light transmitting substrate 1), and a material behind "/" represents an upper layer (a side of the counter electrode 4). The optically transparent electrode 2 can form an anode and a cathode. The optically transparent electrode 2 is preferably the anode.

Preferably, the optically transparent electrode 2 has a small extinction coefficient in a visible light region. For example, the optically transparent electrode 2 may have the extinction coefficient of 0.05 or less in the visible light region, but is not limited thereto.

The optically transparent electrode 2 preferably has a charge mobility of 30 $cm^2/Vs$ or more, and a carrier density of $1 \times 10^{21}$ $cm^{-3}$ or less. Therefore, when optically transparent electrodes 2 have the same resistance value, it is possible to suppress light absorption in a region close to an infrared region of the visible light region, and reduce a loss of absorption. In other words, when the charge mobility and the carrier density are out of this range, in case that they have the same resistance value, causes a tendency to increase the extinction coefficient in the near-infrared region, and light absorbency. On the other hand, by setting the charge mobility and the carrier density as mentioned above, it is possible to suppress the phenomenon. This has been confirmed by experiments. Although there is no upper limit of the charge mobility, it may be 50 $cm^2/Vs$ or less, for example. The carrier density is preferably $1 \times 10^{20}/cm^3$ or more, more preferably $5 \times 10^{20}/cm^3$ or more.

The organic layer 9 forms a functional layer cluster, which is a collection of the functional layers, between the the optically transparent electrode 2 and the counter electrode 4. The organic layer 9 forming the functional layer cluster has a stack of appropriate layers for emitting light by driving the organic EL element. At least one of functional layers is the emission layer 3. The emission layer 3 is a layer containing emitting materials. The emission layer 3 is a layer that emits light as a result of combination of electrons and holes. The emission layer 3 include dopants as emitting materials and base materials for doping the dopant in general.

The organic layer 9 may have multiple emission layers 3. In this case, respective emitting materials of emission layers 3 may be different from each other. And also, respective light wavelengths of the emitting materials may be different from each other. For example, various colors can be made by providing at least three emission layers 3 including a red emission layer, a green emission layer and a blue emission layer to emit light with three colors of red, green and blue. Especially, three colors light emission enables to emit white light and obtain an useful organic EL element for lighting. In addition, for example, white light emission can be obtained from two colors light emission of blue and orange. However, three colors light emission has better luminescence property than two colors light emission.

In the case where emission layers 3 are provided, the single emission layer 3 is shown in FIG. 1, but emission layers 3 may be disposed in the place of the emission layer 3. The organic EL element may have a multi-unit structure. The multi-unit structure is a structure in which light emitting units are stacked via intermediate layers so that one light emitting unit is a group of functional layers having a function to emit light by voltage applied to the anode and the cathode. In this case, examples of the intermediate layer include a layer having light transmittance and electric conductivity, a structure capable of sending holes to one unit and sending electrons to the other unit, a charge generating layer, and the like. In the multi-unit structure, light emitting units stacked along a thickness direction thereof are electrically connected in series and arranged between one anode and one cathode.

The organic layer 9 may have only one emission layer 3. In this case, it is possible to obtain the organic EL element with simple structure. Multiple emitting materials may be used even in either one emission layer 3 or multiple emission layers 3. Therefore, even in the case of one emission layer 3, the emission layer 3 contains multiple emitting materials having different wavelengths, whereby white light can be emitted. However, preferably emission layers 3 are provided in order to well emit white light for lighting.

Besides the emission layer 3, examples of each functional layer forming the organic layer 9 include a hole injection layer, a hole transport layer, an electron transport layer, an electron injection layer, an intermediate layer, and the like. Layers other than the emission layer 3 in the organic layer 9 generally include a functional layer having a function to transport charges (holes or electrons). Here, layers other than the emission layer 3 of the organic layer 9 are defined as a charge transfer layer 8. The charge transfer layer 8 may have a multi-layer structure or a single layer structure. In other words, the charge transfer layer 8 may have a function to transport charges (holes or electrons).

The charge transfer layer 8 is formed of a first charge transfer layer 8a disposed on the optically transparent electrode 2 side of the emission layer 3, and a second charge transfer layer 8b disposed on the counter electrode 4 side of the emission layer 3. In the case where the optically transparent electrode 2 forms the anode and the counter electrode 4 forms the cathode, the first charge transfer layer 8a can be formed of a layer having a function to move holes. Moving holes can be defined as the hole injection and/or transport. In this case, for example, the first charge transfer layer 8a can be formed of the hole injection layer and the hole transport layer from the side of the optically transparent electrode 2. In the case where the optically transparent electrode 2 forms an anode and the counter electrode 4 forms a cathode, the second charge transfer layer 8b can be formed of a layer having a function to move electrons. Moving an electron can be defined as the electron injection and/or transporting. In this case, for example, the second charge transfer layer 8b can be formed of the electron injection layer and the electron transport layer.

Here, a layer touching the counter electrode 4, of functional layers forming the charge transfer layer 8 may be formed of a charge injection layer. In the case where the counter electrode 4 forms the cathode, the charge injection layer is the electron injection layer. The charge injection layer may be a layer of a metal simple substance whose work function is small. For example, the charge injection layer (the electron injection layer) can be formed of Li, Mg, Na, Cs, or the like. However, in the case where the charge injection layer is formed of a layer of the metal simple substance, preferably the charge injection layer has the thickness of 10 nm or less in order to improve the light out-coupling property. Especially in the embodiment, since the counter electrode 4 can be formed of a thin film, preferably the charge injection layer has the thickness in the thickness region. From the viewpoint of charge injection properties, the thickness of the charge injection layer is, for example, 1 nm or more. A mixed film of metal and an organic film can be used as the charge injection layer (the electron injection layer). The mixed film can be formed of a layer where the metal is contained in the organic layer. The thickness of the the charge injection layer in this case is not particularly limited. Examples of the mixed film serving as the electron injection layer include a mixed film of Li and the electron-transporting organic film, a mixed film of Na and the electron-transporting organic film, the mixed film of an alkali metal or an alkaline earth metal and the electron-transporting film, the mixed film of $LiO_2$ or Liq and the electron-transporting organic film, and the like. Examples of the mixed film include a mixed film of organic electronic dopant and the electron-transporting organic film and the like. Note that the charge injection layer is a part of the charge transfer layer 8, and part of the organic layer 9. The organic layer 9 can be defined as a stacking structure in which it is disposed between the optically transparent electrode 2 and the counter electrode 4. Here, even if the charge injection layer is formed of a metal simple substance, the stacking structure is the organic layer 9 that is disposed between the optically transparent electrode 2 and the counter electrode 4. The organic layer 9 may be the stacking structure in which an organic material is contained as a whole, and include an inorganic layer as a part thereof.

The counter electrode 4 is an electrode which is electrically paired with the optically transparent electrode 2. When voltage is applied between the optically transparent electrode 2 and the counter electrode 4, a current flows therebetween and light is generated in the emission layer 3.

One of the optically transparent electrode 2 and the counter electrode 4 forms the anode, and the other forms the cathode. In one embodiment, the optically transparent electrode 2 can form the anode, and the counter electrode 4 can form the cathode. In other embodiment, the optically transparent electrode 2 can form the cathode, and the counter electrode 4 can form the anode. In the organic EL element shown in FIG. 1, preferably the optically transparent electrode 2 forms the anode, and the counter electrode 4 forms the anode. Therefore, it is possible to produce the element having high luminous efficiency more easily.

The counter electrode 4 may be formed of Ag or an alloy containing Ag. By using Ag or an alloy containing Ag (AG-alloy), the light reflectivity can be improved. High light reflectivity can be obtained by using silver because silver has higher light reflectivity in the visible light region than other metallic materials that can be a light reflective electrode. Also, because silver has high conductivity, even if the counter electrode 4 is thinned, it is possible to ensure a function as an electrode.

The counter electrode 4 preferably has light reflectivity. Light can therefore escape from the side of the optically transparent electrode 2 by reflecting light traveling to the side of the counter electrode 4 from the emission layer 3 to change a path of light to the side of the optically transparent electrode 2. However, the counter electrode 4 preferably transmits part of light, rather than reflecting the whole of the light. In other words, the counter electrode 4 preferably has optical transparency. Therefore, because the counter electrode 4 is such a thin film so that it transmits the light, it is possible to suppress a short circuit and easily obtain light reflectivity by the auxiliary reflective layer 6. The counter electrode 4 is preferably formed as a light reflecting electrode having optical transparency.

The alloy containing Ag (Ag-alloy) contains, for example, Ag as the main component and the alloy contains at least one metal selected from Al, Pt, Rh, Mg, Au, Cu, Zn, Ti, Pd, Nd, Bi, and Ni. Especially, AgBi, AgPd, AgMg, AgNdCu, AgPdCu, or the like are exemplified. Ag-alloy is preferably high in the ratio of Ag. Therefore, it is possible to improve light reflectivity. For example, the weight ratio of Ag in the Ag alloy is preferably 90% or more, more preferably 95% or more, further more preferably 98% or more, most preferably 99% or more.

FIG. 2 shows an example of a stacking state of layers constituting the organic EL element. FIG. 2 includes FIG. 2A to FIG. 2D. In these figures, the state immediately after the counter electrode 4 formed of Ag or alloy containing Ag is stacked is shown. An example of occurrence mechanism of short circuit caused by formation of the counter electrode 4 is explained with reference to FIG. 2. FIG. 2A and FIG. 2C show the counter electrode 4 which is thin, and FIG. 2B and FIG. 2D show the counter electrode 4 which is thick.

As shown in FIG. 2, each layer in the organic EL element is stacked in order on the optically transparent substrate 1, and a stack structure including an organic luminant 10 is formed. In stacking process, vapor deposition, sputtering, coating or the like can be appropriately combined. The optically transparent electrode 2 is preferably formed by vapor deposition or sputtering. All or part of the organic layer 9 is preferably formed by vapor deposition. The counter electrode 4 is preferably formed by vapor deposition or sputtering. In vapor deposition and sputtering, it is possible to apply a vacuum process. The vacuum process can suppress moisture intrusion.

Figure 2A:
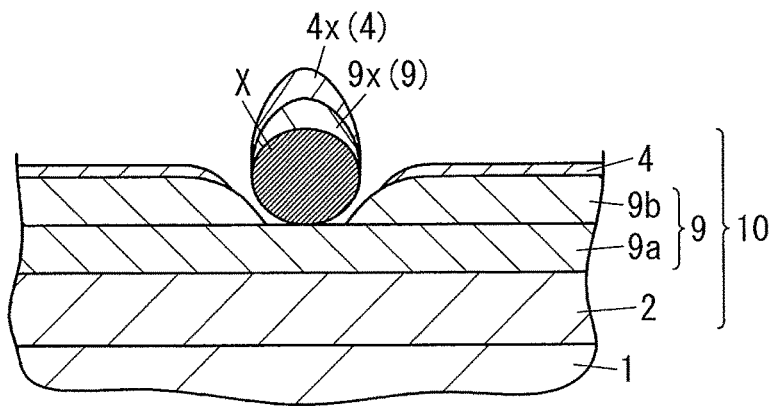
FIG. 2A shows an example of the stacking structure having a thin counter electrode.
Figure 2B:
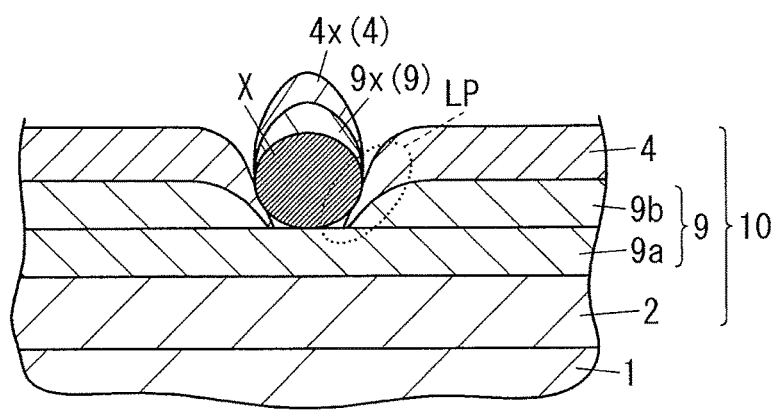
FIG. 2B shows an example of the stacking structure having a thick counter electrode.

In stacking process, the optically transparent electrode 2 can be formed as a layer whose surface is flat. As shown in FIG. 2A and FIG. 2B, a first organic layer 9a (for example, the hole injection layer), which is a layer adjacent to the the optically transparent electrode 2, of the organic layer 9 maybe formed as a layer whose surface is flat. For example, when the first organic layer 9a is formed by coating, a surface thereof is more flat. Of course, the first organic layer 9a may be formed by vapor deposition or sputtering. Note that the hole injection layer may be formed of not only organic materials but also inorganic materials. Examples of inorganic materials include $MoO_3$ and $WO_3$. The hole injection layer may be a mixed film of organic materials having high hole transporting property and these inorganic materials. In the case where the hole injection layer is formed of inorganic materials, the hole injection layer can be part of the organic layer 9.

Figure 2C:
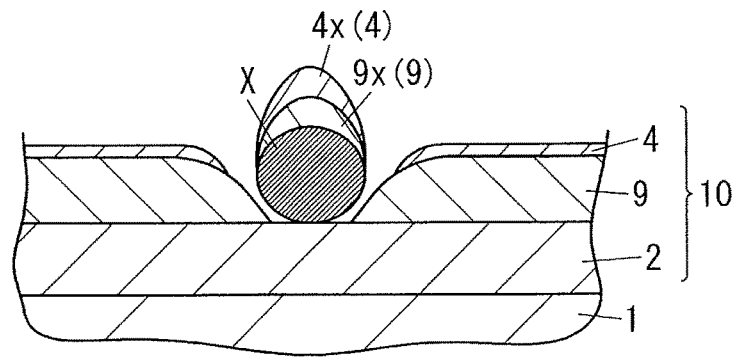
FIG. 2C shows an example of the stacking structure having a thin counter electrode.
Figure 2D:
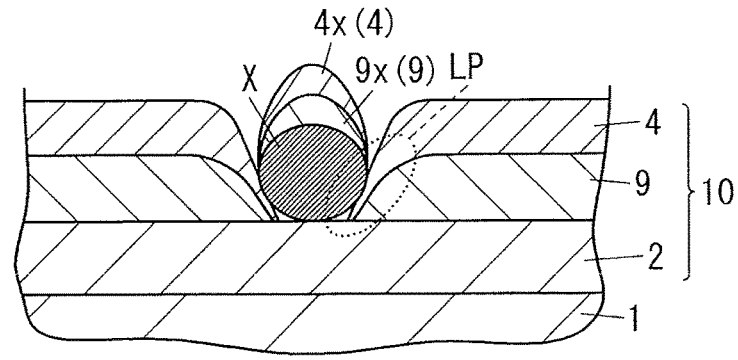
FIG. 2D shows an example of the stacking structure having a thick counter electrode.

Here, on the occasion of stacking, there is a case where a foreign matter X is mixed during stacking process. FIG. 2A and FIG. 2B show the state of adhesion of the foreign matter X on the first organic layer 9a. In this case, when a second organic layer 9b is formed on the first organic layer 9a after the first organic layer 9a is formed, the foreign matter X can be mixed. The second organic layer 9b may have a multilayer structure including functional layers such as the emission layer 3 and the charge transfer layer 8. Mixed of the foreign matter X is more likely to occur when stacking process of the first organic layer 9a is different from that of the second organic layer 9b. For example, when the first organic layer 9a is formed by coating and the second organic layer 9b is formed by vapor deposition, the foreign matter X is likely to be mixed. Of course, even when both the first organic layer 9a and the second organic layer 9b are formed by vapor deposition, the foreign matter X may be mixed depending on stacking method. As shown in FIG. 2C and FIG. 2D, there is a case where the foreign matter X is mixed in an interface between the optically transparent electrode 2 and the organic layer 9. In this example, the state of adhesion of the foreign matter X to the surface of the optically transparent electrode 2 is shown. The organic layer 9 in this case is a combination of the first organic layer 9a and the second organic layer 9b.

As shown in FIG. 2A and FIG. 2B, when the foreign matter X is mixed, the second organic layer 9b and the counter electrode 4 are formed on not only the first organic layer 9a but also the foreign matter X. The second organic layer 9b and the counter electrode 4 formed on the foreign matter X are separated from the second organic layer 9b and the counter electrode 4 normally formed on the first organic layer 9a. In FIG. 2A and FIG. 2B, a separated part of the second organic layer 9b is shown as an organic layer separated part 9x, and a separated part of the counter electrode 4 is shown as a counter electrode separated part 4x. In this case, the foreign matter X hides between the foreign matter X and the first organic layer 9a during stacking of the second organic layer 9b. Therefore, the second organic layer 9b may not be stacked, and the stacking amount of the second organic layer 9b may decrease. In the proximity of the foreign matter X, the second organic layer 9b may have a thickness that is gradually thinner as it approaches the center of the foreign matter X. As a result, a gap can be formed between the foreign matter X and the second organic layer 9b. Similarly, in the case of FIG. 2C and FIG. 2D, the organic layer 9 is divided, and the gap can be formed between the foreign matter X and the organic layer 9.

When the counter electrode 4 is then formed, because silver which is the material of the counter electrode 4 is easy to sneak when it is formed, it can easily intrude and be stacked into the gap between the foreign matter X and the second organic layer 9b (the organic layer 9). The silver is liable to sneak in comparison with other metallic materials for light reflection electrodes.

At this time, as shown in FIG. 2B, when a silver-containing layer of the counter electrode 4 is thick, the counter electrode 4 may intrude into the gap formed of the foreign matter X to be likely to touch the first organic layer 9a, which causes the short circuit. As shown in FIG. 2D, in the case where the foreign matter X is mixed on the optically transparent electrode 2, when the counter electrode 4 (the silver-containing layer) is thick, the counter electrode 4 may touch the optically transparent electrode 2 directly, which causes the short circuit. Part of the counter electrode 4 intruding into the gap formed by the foreign matter X is a leak point (LP). The leak point is a part which causes current not to flow through a normal route, and which causes current leak. The occurrence of the leak point causes the short circuit.

However, as shown in FIG. 2A and FIG. 2C, in the case where thickness of the counter electrode 4 (the silver-containing layer) is thin so that the auxiliary reflective layer 6 can reflect light, the counter electrode 4 is hard to intrude into the gap formed of the foreign matter X, and it is possible to suppress that the counter electrode 4 touches the first organic layer 9a, and so that the counter electrode 4 touches the optically transparent electrode 2. It is therefore possible to suppress the short circuit and improve the electrical reliability. Further, in the case where the counter electrode 4 is thin, there is an advantage of being capable of forming the counter electrode 4 more inexpensively because it is possible to reduce the amount of silver used for the counter electrode 4.

The counter electrode 4 can be formed of a thin film. In other words, the counter electrode 4 can formed of an Ag thin film or an Ag alloy thin film. The counter electrode 4 containing Ag is a thin film, thereby being capable of suppressing sneaking of Ag to improve electrical reliability.

Preferably a thickness of the counter electrode 4 is less than 120 nm. The counter electrode 4 is formed of Ag or alloy containing Ag, but, when the thickness of the counter electrode 4 is over 120 nm, stacking Ag may be liable to cause the short circuit. When the counter electrode 4 is thick, the counter electrode 4 is close to pure silver. When the counter electrode 4 is thick, an amount of silver increases, thereby making it difficult to form the counter electrode 4. In the case where the thickness of the counter electrode 4 is over 120 nm, possibility to totally reflect light is increased, and reflex by the auxiliary reflective layer 6 is hard to be obtained. From a viewpoint thereof, the thickness of the counter electrode 4 is more preferably 110 nm or less. The thickness of the counter electrode 4 is still more preferably 60 nm or less. Therefore, it is possible to further suppress a shot circuit.

The thickness of the counter electrode 4 is preferably 10 nm or more. Therefore, it is possible to improve a light reflectivity of the counter electrode 4, and to obtain high reflex by silver or alloy containing silver. And, when the thickness of the counter electrode 4 is too thin, there is a risk that a conductivity of the counter electrode 4 decreases. However, because silver has high conductivity, when the thickness of the counter electrode 4 is less than 10 nm, it is possible to secure enough conductivity. The thickness of the counter electrode 4 is preferably in thickness region of 10 to 60 nm. The More preferable thickness of the counter electrode 4 is set by a material of the auxiliary reflective layer 6 and a thickness of that.

The counter electrode preferably has a refractive index of 0.17 or less in wavelength regions of 440 to 460 nm, 550 to 570 nm and 610 to 630 nm. It is therefore possible to easily form the counter electrode 4 having light reflectivity and optical transparency. A wavelength in the range of 440 nm to 460 nm is a representative wavelength of blue. A wavelength in the range of 550 nm to 570 nm is a representative wavelength of green. A wavelength in the range of 610 nm to 630 nm is a representative wavelength of red. Therefore, when the refractive index is low in blue, green and red wavelengths, from a short wavelength to a long wavelength in a visible light region, the counter electrode 4 can have advantageous structure. Preferably the refractive index of the counter electrode 4 is 0.17 or less in a whole visible region. The counter electrode 4 can therefore have more advantageous structure. The whole visible region may be the wavelength region of 400 nm to 780 nm. The refractive index of the counter electrode 4 is preferably as low as possible, a lower limit thereof is not particularly limited, but from a viewpoint of production, the refractive index of the counter electrode 4 may be 0.01 or more. Further, the refractive index of the counter electrode 4 may be 0.05 or more.

The counter electrode 4 preferably has an extinction coefficient of 5.0 or less in wavelength regions of 440 to 460 nm, 550 to 570 nm and 610 to 630 nm. It is therefore possible to suppress light absorption by the counter electrode 4, and easily form the counter electrode 4 having both light reflectivity and optically transparency. A wavelength in the range of 440 nm to 460 nm is a representative wavelength of blue. A wavelength in the range of 550 nm to 570 nm is a representative wavelength of green. A wavelength in the range of 610 nm to 630 nm is a representative wavelength of red. Therefore, when the extinction coefficient is low in blue, green and red wavelengths, from a short wavelength to a long wavelength in a visible light region, the counter electrode 4 can have a more advantageous structure. The extinction coefficient of the counter electrode 4 is preferably 5.0 or less in a whole visible light region. The counter electrode 4 can therefore have further advantageous structure. The whole visible region may be the wavelength region of 400 nm to 780 nm. The extinction coefficient of the counter electrode 4 is preferably as low as possible, a lower limit therefore is not particularly limited, but from a viewpoint of production, the extinction coefficient of the counter electrode 4 may be 0.5 or more. The extinction coefficient of the counter electrode 4 may be 1.0 or more.

The counter electrode 4 preferably has reflectivity in a visible light region. An upper limit of the reflective index of the counter electrode 4 is not limited, but from a viewpoint of suppressing the short circuit and obtaining available reflection by the auxiliary reflective layer 6, the reflective index of the counter electrode 4 in the visible light region may be 90% or less. Further, in order to prevent the short circuit, the reflective index of the counter electrode 4 in the visible region may be 50% or less.

The auxiliary reflective layer 6 is a layer supporting a reflection of the counter electrode 4. The auxiliary reflective layer 6 is disposed on an opposite side of the counter electrode 4 from emission layer 3. As described above, in the case where the counter electrode 4 is thin, part of light passes therethrough to travel to an opposite side thereof from a light out-coupling side (a side of the optically transparent electrode 2). Therefore, by disposing the auxiliary reflective layer 6, it is possible to reflect the light passing through the counter electrode 4 to turn a traveling direction of the light to the side of the optically transparent electrode 2. It is therefore possible to improve the light out-coupling property. In the organic EL element, light reflecting structure which reflects light from the emission layer 3 is formed of the counter electrode 4 having reflectivity and the auxiliary reflective layer 6.

In the auxiliary reflective layer 6, light reflectance in a visible light region is preferably 60% or more. It is therefore possible to reflect more light and improve the light-coupling property. The reflective index of the auxiliary reflective layer 6 in the visible light region is preferably 70% or more, still more preferably 80% or more, and most preferably 90% or more. Preferably the auxiliary reflective layer 6 has a high light reflectance, but an upper limit thereof is not limited, but in consideration of light absorption and material properties, light reflectance of the auxiliary reflective layer 6 may be 95% or less.

The auxiliary reflective layer 6 is preferably formed of metal materials. It is therefore possible to obtain high light reflectivity easily. Examples of metal materials used for the auxiliary reflective layer 6 include, but not limited to, Al, Mg, Ca, Ti, Cu, Au, an alloy of these and the like. Al and Mg of these materials are more preferable as the material of the auxiliary reflective layer 6. Al and Mg have relatively uniformly high reflectivity in the whole visible light region, and therefore auxiliary reflectivity can be improved. Al is preferably used in particular. Al can suppress a reduction loss in reflectivity of a thinned counter electrode 4, provide easy stacking process. Al is relatively cheap material, and can therefore provide easy production. Of cause, the auxiliary reflective layer 6 may be formed of light reflective materials except metal materials. For example, a reflective layer formed of $SiO_2$ or $TiO_2$ may be used. The auxiliary reflective layer 6 may exclude Ag. By excluding Ag, more easy production can be provided.

The thickness of the auxiliary reflective layer 6 is preferably 30 nm or more. It is therefore possible to improve the reflectivity of the auxiliary reflective layer 6. The thickness of the auxiliary reflective layer 6 is more preferably 50 nm or more. An upper limit of the thickness of the auxiliary reflective layer 6 is not limited in particular, but when the thickness of the auxiliary reflective layer 6 is too thick, there is a possibility of wasting materials, and generating a side effect that a deposition process time is increased. Therefore, the thickness of the auxiliary reflective layer 6 is preferably 200 nm or less. The thickness of the auxiliary reflective layer 6 is preferably thicker than that of the counter electrode 4. It is therefore possible to obtain high auxiliary reflex. More preferable thickness of the auxiliary reflective layer 6 can be set depending on the material of the auxiliary reflective layer 6, the material of the counter electrode 4, and the thickness of the counter electrode 4.

By the way, the auxiliary reflective layer 6 may be formed of Ag or an alloy containing Ag. In this case, it is possible to get high light reflectance. Also, the diffusion-preventing layer 5 is disposed between the counter electrode 4 and the auxiliary reflective layer 6. Therefore, the gap by the foreign matter X is filled by the diffusion-preventing layer 5, and silver sneaking during deposition can be suppressed, and the short circuit can be suppressed. In this case, the diffusion-preventing layer 5 serves as the layer which suppress silver sneaking (sneaking-suppressing layer). However, when the auxiliary reflective layer 6 is thin, there is a possibility that short circuit caused by the silver sneaking cannot be suppressed sufficiently. Also, when the auxiliary reflective layer 6 is formed of silver, there is a possibility that economic efficiency will go down by materials being expensive. Therefore, the auxiliary reflective layer 6 preferably excludes Ag.

The diffusion-preventing layer 5 is a layer which can prevent components from diffusing and moving between the counter electrode 4 and the auxiliary reflective layer 6. The diffusion-preventing layer 5 is disposed between the auxiliary reflective layer 6 and the counter electrode 4. The diffusion-preventing layer 5 is a barrier, and diffusing of components from the counter electrode 4 to the auxiliary reflective layer 6 and diffusing of components from the auxiliary reflective layer 6 to the counter electrode 4 are suppressed. It is therefore possible to improve reflectivity.

Here, as a structure for improving reflectivity, a structure to dispose the auxiliary reflective layer 6 so that it touches the counter electrode 4 can be exemplified. However, when the counter electrode 4 is in directly contact with the auxiliary reflective layer 6, there is a possibility that components diffuse and move by an interdiffusion between the counter electrode 4 and the auxiliary reflective layer 6. In the organic EL element, a temperature rises along with a drive in general, and an interdiffusion is likely to occur at higher temperature. For example, when the auxiliary reflective layer 6 of metal material is stacked directly on the counter electrode 4 formed of Ag or alloy containing Ag, metals in the auxiliary reflective layer 6 diffuses with time, and metals are mixed into the counter electrode 4. A phenomenon called migration can occur. Specifically, in the case where the counter electrode 4 is formed of only Ag, Ag is alloyed. In the case where the counter electrode 4 is formed of Ag alloy, other metals different from Ag alloy are mixed or a content ratio of metals varies, thereby denaturing a composition of the Ag alloy. When metals other than Ag or Ag-alloy which originally forms the counter electrode 4 are mixed into the counter electrode 4, there is a concern that reflectivity reduces. When metals other than Ag or Ag-alloy which originally forms the counter electrode 4 are also mixed into the counter electrode 4, there is a concern that electrical property of the counter electrode 4 is denatured. Accordingly, in the above organic EL element, the diffusion-preventing layer 5 is disposed between the counter electrode 4 and the auxiliary reflective layer 6. Therefore, components diffusion between the counter electrode 4 and the auxiliary reflective layer 6 are suppressed, and accordingly it is possible to suppress a temporal decrease with time in reflectance and denaturation of electrical properties. By separating the counter electrode 4 and the auxiliary reflective layer 6, moving of atoms and/or molecules is prevented, and interdiffusion is suppressed. In this embodiment, the diffusion-preventing layer 5 is disposed so that it touches the counter electrode 4, and the diffusion-preventing layer 5 is disposed so that it touches the auxiliary reflective layer 6.

The diffusion-preventing layer 5 preferably has an extinction coefficient of 0.1 or less in wavelength regions of 440 to 460 nm, 550 to 570 nm and 610 to 630 nm. It is therefore possible to suppress wastefully absorbing of light by the diffusion-preventing layer 5, and obtain higher reflectivity by the auxiliary reflective layer 6. A wavelength in the range of 440 nm to 460 nm is a representative wavelength of blue. A wavelength in the range of 550 nm to 570 nm is a representative wavelength of green. A wavelength in the range of 610 nm to 630 nm is a representative wavelength of red. Therefore, when the extinction coefficient is low in blue, green and red wavelengths from a short wavelength to a long wavelength in a light visible region, the diffusion-preventing layer 5 can have a more advantageous structure. The extinction coefficient of the diffusion-preventing layer 5 is preferably 0.01 or less in the whole visible light region. The diffusion-preventing layer 5 can further have a more advantageous structure. The whole visible light region may be a wavelength region of 400 to 780 nm. The extinction coefficient of the diffusion-preventing layer 5 may be as low as possible, and the lower limit is not limited in particular, from the viewpoint of the production, the extinction coefficient of the diffusion-preventing layer 5 may be 0.0001 or more.

The diffusion-preventing layer 5 is preferably thinner than the counter electrode 4. It is therefore possible to improve reflective efficiency and the light out-coupling property. When the thickness of the diffusion-preventing layer 5 is thicker than the thickness of the counter electrode 4, there is a concern that light absorption by the diffusion-preventing layer 5 becomes larger. When the thickness of the diffusion-preventing layer 5 is thick, a light interference effect by light passing through the counter electrode 4 becomes larger, and reflectivity as a whole light reflecting structure may decrease. Therefore, the diffusion-preventing layer 5 is preferably thinner than the counter electrode 4.

The diffusion-preventing layer 5 preferably has a thickness of 5 nm or more. It is therefore possible to improve an effect of preventing diffusion of components. The diffusion-preventing layer 5 preferably has a thickness of 20 nm or less. It is therefore possible to suppress light absorption by the diffusion-preventing layer 5 and reduce an effect of light interference. The the diffusion-preventing layer 5 more preferably has a thickness of 10 nm or less.

In a preferable embodiment, the diffusion-preventing layer 5 has insulation properties. When the diffusion-preventing layer 5 has conductive property, there is a concern that interdiffusion occurs between the diffusion-preventing layer 5 and the counter electrode 4.

The diffusion-preventing layer 5 preferably contains material of which dipole moment is 0.1 D or more. It is therefore possible to improve an effect of suppressing the diffusion of components. By using a substance having polarity by dipole moment of 0.1 D or more, an effect of suppressing the diffusion of components from the auxiliary reflective layer 6 to the counter electrode 4 and the diffusion of components from the counter electrode 4 to the auxiliary reflective layer 6 are improved. An upper limit of the dipole moment is not limited in particular, but may be, for example, 10 D or less.

The diffusion-preventing layer 5 may be formed of appropriate materials preventing interdiffusion between the counter electrode 4 and the auxiliary reflective layer 6. The diffusion-preventing layer 5 may preferably be formed of inorganic materials. Inorganic materials can suppress light absorption and improve diffusion-preventing effect by the diffusion-preventing layer 5. Of course, the diffusion-preventing layer 5 may be formed of organic materials like resins. In this case, the organic material having low reflectivity is preferably used. The diffusion-preventing layer 5 may be formed of various materials that can be used as a hole transport layer or an electron transport layer in the organic layer 9. Examples of materials of the diffusion-preventing layer 5 include NPB, BCP, TPD, Bphen, CBP and the like.

Examples of materials of the diffusion-preventing layer 5 include metal fluoride, metal oxide, silicon oxide, silicon nitride, metal nitride, silicon oxynitride, metal oxynitride, and the like. These materials may have insulation properties. Of these, materials of which dipole moment is 0.1 D or more are preferably used. Specifically, examples of materials of the diffusion-preventing layer 5 include LiF, $MgF_2$, $SiO_2$, $AL_2O_3$, SiON, TiON, and the like. LiF of the examples is more preferable. In the case of LiF, it is possible to obtain a high effect of preventing the diffusion and provide easy production.

The diffusion-preventing layer 5 and the auxiliary reflective layer 6 can be formed by an appropriate method. In a preferable embodiment, the diffusion-preventing layer 5 is formed by vapor deposition or spattering. It is therefore possible to efficiently form the diffusion-preventing layer 5 that is thin. In a preferable embodiment, the auxiliary reflective layer 6 is formed by vapor deposition or spattering. It is possible therefore to efficiently form the auxiliary reflective layer 6 having high reflectivity. Preferably the counter electrode 4, the diffusion-preventing layer 5 and the auxiliary reflective layer 6 are formed by the same stacking process. In this case, these layers can be continuously stacked and formed, and accordingly layers can be formed efficiently.

In the organic EL element, the organic luminant 10 is normally sealed. Moisture intrusion from the outside is suppressed by sealing, and deterioration of the element can be suppressed. In an example of FIG. 1, sealing can be carried out by a sealing substrate which is disposed so as to face the optically transparent substrate 1 on the side of the organic luminant 10. In the case of sealing, the optically transparent electrode 2 and the counter electrode 4 may be provided with a wiring pullout structure in which a wire can be pulled out from an inside of a sealing region to the outside, in order to supply electricity from the outside to the emission layer 3.

Figure 3:
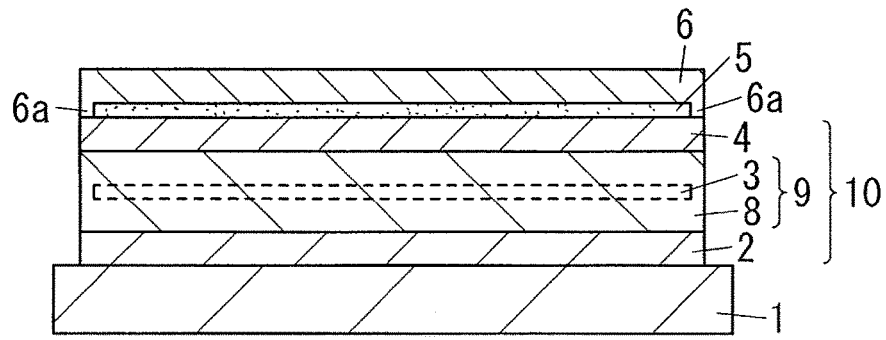
FIG. 3 is a sectional view showing an example of an organic electroluminescent element in an embodiment.
Figure 3:

FIG. 3 shows another embodiment of the organic EL element. The same structure as the organic EL element of FIG. 1 is omitted by assigning the same reference numerals. In FIG. 3, an outer edge of the emission layer 3 is shown by dashed lines.

In the organic EL element of FIG. 3, the auxiliary reflective layer 6 is electrically conductive. The auxiliary reflective layer 6 is electrically connected to the counter electrode 4 in a region where the emission layer 3 is not formed. The auxiliary reflective layer 6 has electrical conductivity, and the auxiliary reflective layer 6 and the counter electrode 4 are electrically connected, whereby the auxiliary reflective layer 6 can serve as part of an electrode and electric conductivity of the counter electrode 4 can be improved by the auxiliary reflective layer 6. It is therefore possible to further improve electrical reliability. The region where the emission layer 3 is not formed may be a region where the emission layer 3 is not formed in planar view. Planar view is defined as a view seen from a direction perpendicular to a surface of the substrate. Planar view may be same as a view seen from a front direction with respect to a light-emitting surface.

The electrical connection of the auxiliary reflective layer 6 and the counter electrode 4 may be carried out by directly connecting the auxiliary reflective layer 6 with the counter electrode 4. It is therefore possible to easily electrically connect them. Here, when the auxiliary reflective layer 6 is directly contacted with the counter electrode 4, the interdiffusion may occur, but it is possible to reduce the influence on the light emission even if the interdiffusion occurs because part in which the auxiliary reflective layer 6 is electrically connected with the counter electrode 4 is a region which is not overlapped with the emission layer 3.

Preferably the auxiliary reflective layer 6 is electrically connected to the counter electrode 4 on the outside of the emission layer 3 in planar view. It is therefore possible to electrically connect the auxiliary reflective layer 6 and the counter electrode 4 without preventing light emission at the center of a plane of the emission layer 3. In FIG. 3, the emission layer 3 is, as indicated by a broken line, slightly smaller than the whole stacking structure of the organic luminant 10. A layer other than the emission layer 3 of the organic layer 9, for example, the charge transfer layer 8 may be stacked on a side (or a periphery) of the emission layer 3. In FIG. 3, the diffusion-preventing layer 5 is slightly smaller than the counter electrode 4. The auxiliary reflective layer 6 is in contact with the counter electrode 4 on a side (or a periphery) of the diffusion-preventing layer 5 which is a region overlapping with a region, in which the emission layer 3 is not formed, in planar view. For this reason, it is possible to improve the light out-coupling property and electrical property. A part of the auxiliary reflective layer 6, in contact with the counter electrode 4, becomes an electrical connection 6a.

The diffusion-preventing layer 5 is preferably equal to or larger than the emission layer 3 in planar view. It is therefore possible to obtain a high effect of preventing the diffusion of components in a region where the emission layer 3 is formed.

When the organic EL element of FIG. 3 is produced, the emission layer 3 is made smaller in planar view than a layer other than the emission layer 3 of the organic layers 9. The diffusion-preventing layer 5 is then formed on the counter electrode 4 so that it is smaller than the counter electrode 4 and equal to or larger than the emission layer 3. Subsequently, the auxiliary reflective layer 6 is formed so that it is larger than the diffusion-preventing layer 5. It is therefore possible to electrically connect the auxiliary reflective layer 6 with the counter electrode 4 in a region where the emission layer 3 is not formed in planar view.

Figure 4:
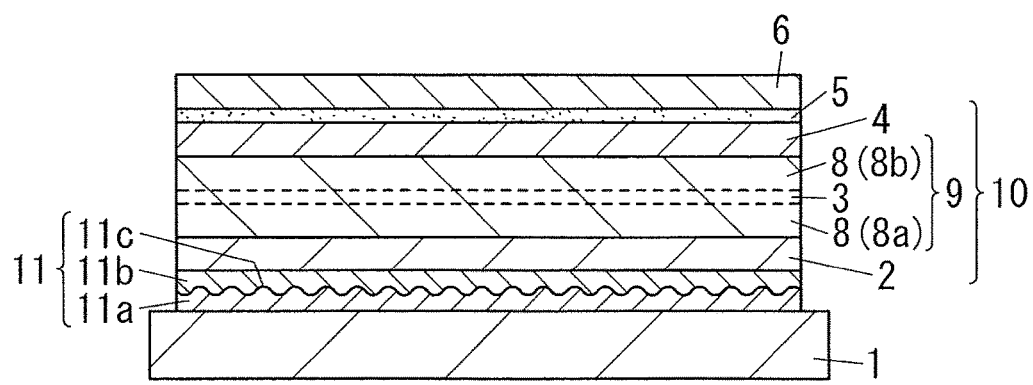
FIG. 4 is a sectional view showing an example of an organic electroluminescent element in an embodiment.
Figure 4:

FIG. 4 shows other embodiment of the organic EL element. The same structure as the organic EL element of FIG. 1 is omitted by assigning the same reference numerals. The embodiment of FIG. 4 differs from that of FIG. 1 in that a light out-coupling structure 11 is provided. Other structures are formed in the same manner. FIG. 4 illustrates an example in which the embodiment of FIG. 1 is formed with the light out-coupling structure 11, but the light out-coupling structure 11 may be formed in an embodiment of FIG. 3.

Preferably the organic EL element includes an optically transparent substrate 1 that is disposed on the opposite side of the optically transparent electrode 2 from the emission layer 3. The light out-coupling structure 11 is disposed on a surface, on a side of the optically transparent electrode 2, of the optically transparent substrate 1. Refractive index difference in a substrate interface and total reflection are reduced by disposing the light out-coupling structure 11, and therefore more light will escape. In the case where light is reflected by the auxiliary reflective layer 6 as described above, light reflected by the counter electrode 4 and light reflected by the auxiliary reflective layer 6 are mixed as reflected light, but the reflected light can escape more efficiently by forming the light out-coupling structure 11.

In FIG. 4, the light out-coupling structure 11 is disposed between the optically transparent electrode 2 and the optically transparent substrate. The light out-coupling structure 11 is preferably formed as a light out-coupling layer. In a preferable embodiment, the light out-coupling structure 11 is formed of a resin layer. Refractive index difference is reduced in the resin layer, thereby improving the light out-coupling property. In a preferable embodiment, the light out-coupling structure 11 has a stacking structure. In the stacking structure, it is possible to further reduce refractive index difference. In FIG. 4, the light out-coupling structure 11 includes the stacking structure of a first transparent material layer 11a and a second transparent material layer 11b. The first transparent material layer 11a is disposed on the side of the optically transparent substrate 1, and the second transparent material layer 11b is disposed on the side of the optically transparent electrode 2. This stacking structure preferably includes a stack of a high refractive index layer and a low refractive index layer. In this case, one of the first transparent material layer 11a and the second transparent material layer 11b is the high refractive index layer, and the other is the low refractive index layer. In a preferable embodiment, the first transparent material layer 11a is the low refractive index layer, and the second transparent material layer 11b is the high refractive index layer.

In a more preferable embodiment, the light out-coupling structure 11 includes a roughness structure 11c. The roughness structure 11c is preferably disposed in an interface of the stacking structure including the first transparent material layer 11a and the second transparent material structure 11b. In roughness structure 11c, light is scattered by roughness interface, and it is therefore possible to suppress total reflection by the surface of the optically transparent substrate 1 and improve the light out-coupling property. The roughness structure 11c may be fine irregularities of nanometer order. It is therefore provided with light scattering property, and can further improve light out-coupling property. The roughness structure 11c is preferably disposed in an interface of a low refractive index layer and a high refractive index layer. The low refractive index layer and the high refractive index layer may be formed of resins. The high refractive index layer may contain high refractive index particles in order to adjust refractive index.

As another embodiment of the light out-coupling structure 11, the light out-coupling structure 11 including resins mixed with particles that causes disturbance to light refraction can be used. In this case, the light out-coupling structure 11 may be a single layer. The light out-coupling structure 11 may also include structure where the surface of the optically transparent electrode 2 side of the optically transparent substrate 1 is roughness surface.

Preferably, in each of above embodiments, light out-coupling structure is further provided on a surface of outside of the optically transparent substrate 1 (on an opposite side thereof from the optically transparent electrode 2). This light out-coupling structure may be provided with a light out-coupling layer, or formed so that the optically transparent substrate 1 has a roughness surface. The light out-coupling structure can be formed of, for example, a light scattering structure. For example, the light out-coupling structure can be easily formed by sticking an optical film. In the case where the light out-coupling structure is provided on both side of the optically transparent substrate 1, it is possible to improve light out-coupling property.

Figure 5:
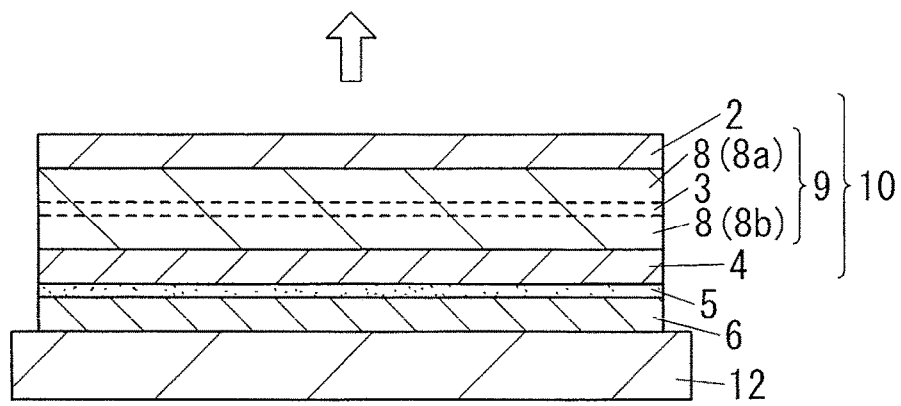
FIG. 5 is a sectional view showing an example of an organic electroluminescent element in an embodiment.

FIG. 5 shows other embodiment of the organic EL element. The same structure as the organic EL element of FIG. 1 is omitted by assigning the same reference numerals.

In FIG. 5, the auxiliary reflective layer 6, the diffusion-preventing layer 5, the counter electrode 4, the organic layer 9 and the optically transparent electrode 2 are disposed in this order on a support member 12 as the support substrate. Light generated in the emission layer 3 will escape from the opposite side thereof from the support member 12. In FIG. 5, the organic EL element having top emission structure is shown. In the organic EL element, not only bottom emission structure like FIG. 1 but also top emission structure can use structure having the auxiliary reflective layer 6 and diffusion-preventing layer 5. FIG. 5 shows a modified example of the embodiment in FIG. 1 having top emission structure, but the Embodiment of FIG. 3 may be modified so that it has top emission structure. In FIG. 5, the optically transparent substrate 1 is not shown, but the optically transparent substrate 1 may be used as the sealing substrate. In this case, the optically transparent substrate 1 and the optically transparent electrode 2 may be separated.

In the embodiment of FIG. 5, the diffusion-preventing layer 5 and the auxiliary reflective layer 6 are disposed on an opposite side of the counter electrode 4 from the light-emitting side, and accordingly it is possible to improve light reflectivity and light-emitting property. The interdiffusion between the counter electrode 4 and the auxiliary reflective layer 6 can be also suppressed. But, from the viewpoint of reducing the short circuit more effectively, the embodiment of FIG. 1 where the optically transparent substrate 1 is disposed on the side of the optically transparent electrode 2 as the support substrate is advantageous.

The lighting device has the above organic EL element. Since the lighting device has the organic EL element, the lighting device having good luminescent can be obtained. For example, a light-emitting face of one organic EL element can be shaped like a rectangle having a width of 10 cm or more and a depth of 10 cm or more, but is not limited to this. The lighting device may have multiple organic EL elements arranged in layers. The lighting device may have wiring structure that supplies electricity to the organic EL element. The lighting device may have a housing configured to support the organic EL element. The lighting device may have plug configured to electrically connect the organic EL element and a power supply. The lighting device can be formed like a panel. The lighting device can be formed like a plane. The lighting device can be thinned, and accordingly it is possible to provide a space-saving lighting device.

Figure 6:
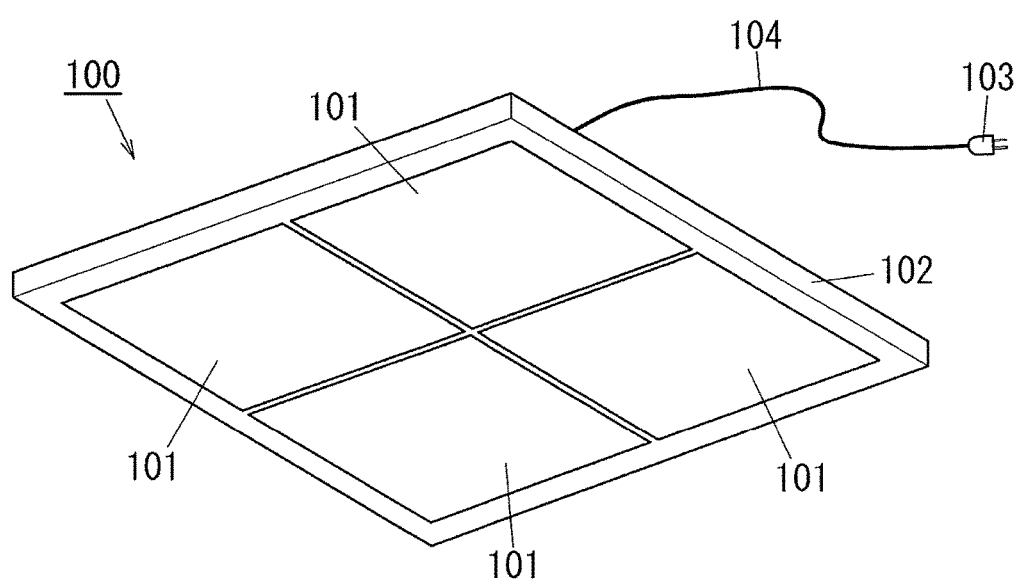
FIG. 6 is a schematic perspective view showing an example of a lighting device.

FIG. 6 is an example of a lighting device. This lighting device 100 includes an organic EL element 101, a housing 102, a plug 103 and a wire 104. In FIG. 6, multiple (four) organic EL elements 101 are disposed in layers. The organic EL element 101 is housed in the housing 102. Electricity is supplied through the plug 103 and the wiring 104, whereby the organic EL elements 101 generates light and the light is emitted from the lighting device 100.

WORKING EXAMPLE

In order to confirm that above reflecting structure is useful, a stack with the counter electrode, the diffusion-preventing layer and the auxiliary reflective layer (Working example 1) was formed and a stack with the counter electrode and the auxiliary reflective layer and without the diffusion-preventing layer (Comparative example 1) was formed, of which temporal reflectivity were put to the test. The counter electrode was an Ag layer having the thickness of 30 nm, the diffusion-preventing layer was a LiF layer having the thickness of 5 nm, and the auxiliary reflective layer was an Al layer having the thickness of 60 nm. Temporal reflectivity was identified by comparing the early light reflectance (0 h) and the light reflectance after heating treatment at 90 C for 71 hour (71 h). A reflective sheet formed, as a counter electrode, of Ag layer having the thickness of 120 nm (Comparative example 2), and a reflective sheet formed, as a counter electrode, of Al layer having the thickness of 100 nm (Comparative example 3) were formed for comparison, and reflective indexes thereof were identified. When Comparative example 2 was used as the counter electrode of the organic EL element, the short circuit caused by the thick Ag layer was identified.

Figure 7A:
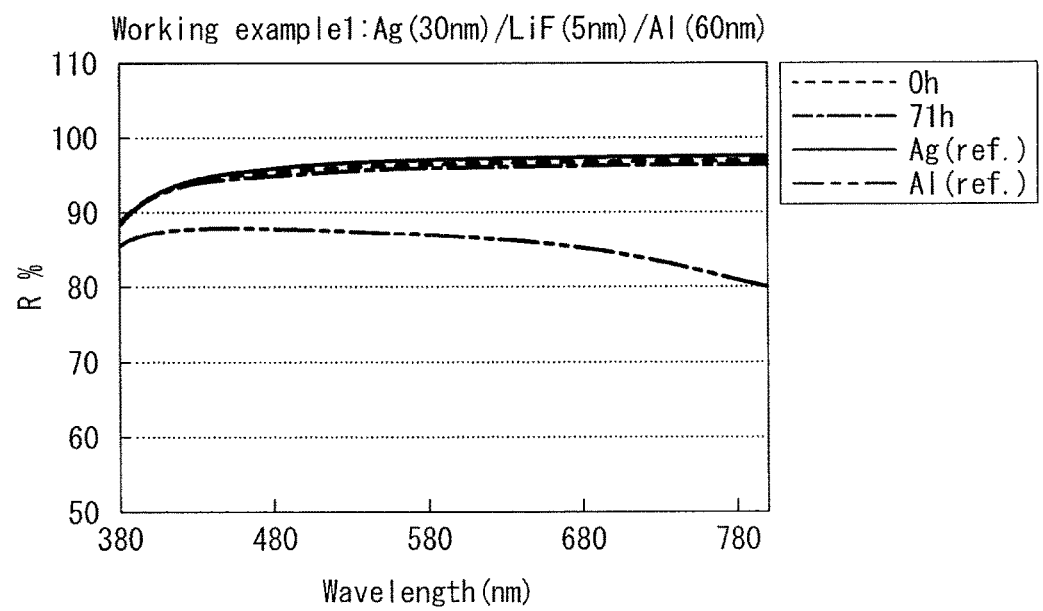
FIG. 7A shows a working example 1.
Figure 7B:
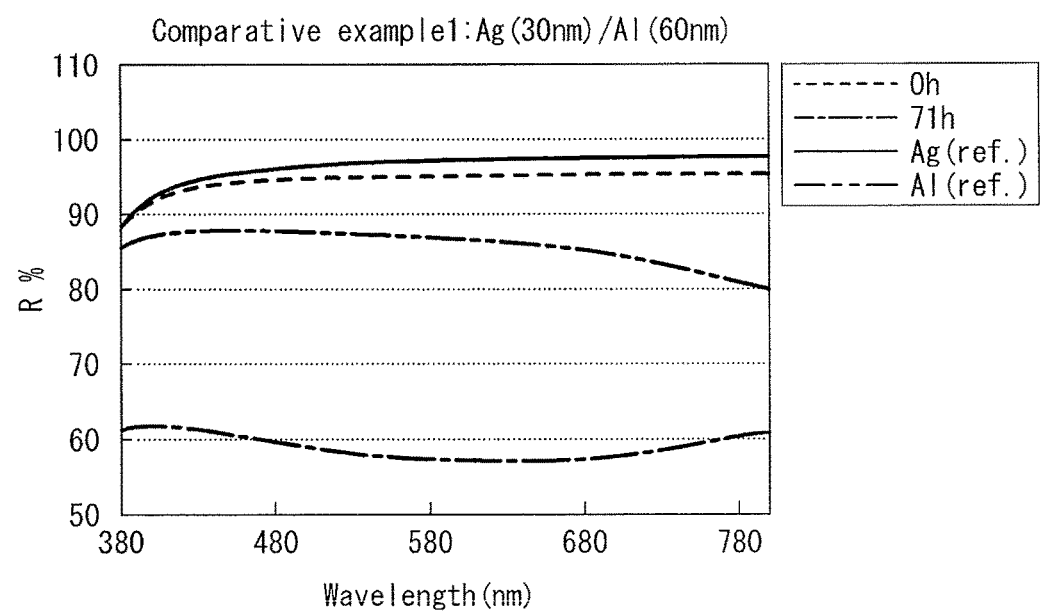
FIG. 7B shows a comparative example 1.

FIG. 7 is a graph showing reflective property of reflecting structure. FIG. 7 includes FIG. 7A and FIG. 7B. FIG. 7A shows Working example 1. FIG. 7B shows Comparative example 1. From FIG. 7, it is identified that Comparative example 3 having the counter electrode formed of Al has lower reflectivity than Comparative example 2 having the counter electrode formed of Ag, and that forming the counter electrode with Ag is of advantage (See "ref" in the graph). But, the reflective sheet formed of Ag may have a problem of short circuit by leaking. Therefore, it is of advantage that Ag layer is thinned and the auxiliary reflective layer is provided. It is identified that as shown in FIG. 7B the light reflectance reduces temporally in the case without the diffusion-preventing layer (Comparative example 1), but it is identified that as shown in FIG. 7A reduction of reflective index is suppressed in the case with the diffusion-preventing layer (Working example 1) (see "0 h" and "71 h"). In FIG. 7B, it is considered that the reflective index is reduced by alloying Ag. On the other hand, in FIG. 7A, it is considered that the reflective index is kept by suppressing alloying Ag. Thus, it was identified that the reflecting structure stacking the counter electrode, the diffusion-preventing layer and the auxiliary reflective layer was effective.

Furthermore, an organic EL element including stacking structure (Working example 2) was formed. In the stacking structure, the light out-coupling structure is between the optically transparent substrate and the optically transparent electrode, and includes the low refractive index layer and the high refractive index layer, and has the roughness structure in an interface thereof. This organic EL element includes a counter electrode of an Ag layer having the thickness of 15 nm, a diffusion-preventing layer of a LiF layer having the thickness of 8 nm, and an auxiliary reflective layer of an Al layer having the thickness of 50 nm. The organic EL element with an Ag layer as the counter electrode having the thickness of 100 nm and without the diffusion-preventing layer, the auxiliary reflective layer and the light out-coupling structure, obtained by Comparative example 3, was formed as comparison. A test comparing electrical property of the organic EL element of Working example 2 with that of the organic EL element of Comparative example 3 was carried out. Result of electrical property is shown in TABLE. 1.

As shown in TABLE. 1, Working example 2 had higher brightness, higher electrical power efficiency, higher external quantum efficiency and higher color rendering (R9, Ra) than Comparative example 3. Particularly, it was identified that light out-coupling efficiency (external quantum efficiency) was improved by 16%.

TABLE 1

| | Working example 2 | Comparative example 3 |
| --- | --- | --- |
| light reflecting structure (film thickness: nm) | Ag(15)/LiF(8)/AL(50) | Al(100) |
| voltage (V) | 6.58 | 6.64 |
| brightness (cd/m$^2$) | 3023 | 2714 |
| electrical power efficiency (lm/W) | 59.0 | 51.1 |
| external quantum efficiency (%) | 55.6 | 48 |
| chromaticity (x, y) | (0.413, 0.400) | (0.412, 0.399) |
| R9 | 4.8 | 1.9 |
| Ra | 79.5 | 78.9 |

The invention claimed is:

1. An organic electroluminescent element comprising:
    an optically transparent electrode;
    a counter electrode which is paired with the optically transparent electrode and formed of Ag or an alloy containing Ag and has light reflectivity;
    an emission layer disposed between the optically transparent electrode and the counter electrode;
    an auxiliary reflective layer disposed on an opposite side of the counter electrode from the emission layer; and
    a diffusion-preventing layer which is disposed between the counter electrode and the auxiliary reflective layer whose components are prevented from diffusing and moving therebetween, the diffusion-preventing layer having insulation properties.

2. The organic electroluminescent element according to claim 1, wherein
    the counter electrode has a refractive index of 0.17 or less in wavelength regions of 440 to 460 nm, 550 to 570 nm and 610 to 630 nm,
    the counter electrode has an extinction coefficient of 5.0 or less in wavelength regions of 440 to 460 nm, 550 to 570 nm and 610 to 630 nm.

3. The organic electroluminescent element according to claim 1, wherein
    the diffusion-preventing layer has an extinction coefficient of 0.1 or less in wavelength regions of 440 to 460 nm, 550 to 570 nm and 610 to 630 nm.

4. The organic electroluminescent element according to claim 1, wherein
    the diffusion-preventing layer is thinner than the counter electrode.

5. The organic electroluminescent element according to claim 1, wherein the diffusion-preventing layer contains a material of which dipole moment is 0.1 D or more.

6. The organic electroluminescent element according to claim 1, wherein the auxiliary reflective layer is electrically conductive, and the auxiliary reflective layer is electrically connected to the counter electrode in a region where the emission layer is not formed.

7. The organic electroluminescent element according to claim 1, further comprising:

an optically transparent substrate disposed on an opposite side of the optically transparent electrode from the emission layer; and a light out-coupling structure disposed on a surface, on a side of the optically transparent electrode, of the optically transparent substrate.

8. A lighting device comprising:

the organic electroluminescent element according to claim 1 and wiring.

\* \* \* \* \*